United States Patent [19]

Eldridge et al.

[11] 4,183,781

[45] Jan. 15, 1980

[54] STABILIZATION PROCESS FOR ALUMINUM MICROCIRCUITS WHICH HAVE BEEN REACTIVE-ION ETCHED

[75] Inventors: Jerome M. Eldridge, Saratoga; Wen-yaung Lee, San Jose, both of Calif.; Geraldine C. Schwartz, Poughkeepsie, N.Y.

[73] Assignee: International Business Machines Corporation, Armonk, N.Y.

[21] Appl. No.: 945,164

[22] Filed: Sep. 25, 1978

[51] Int. Cl.$^2$ ............................................. C23F 1/02
[52] U.S. Cl. ............................... 156/643; 156/646; 156/656; 204/192 E; 427/88; 427/383 A
[58] Field of Search ............... 427/88, 90, 91, 272, 427/383 R, 383 A; 156/643, 646, 656, 659, 665; 204/192 CE, 192 E

[56] References Cited

U.S. PATENT DOCUMENTS

| | | | |
|---|---|---|---|
| 3,753,768 | 8/1973 | Ichiki et al. | 427/383 R |
| 4,026,742 | 5/1977 | Fujino | 156/643 |
| 4,057,460 | 11/1977 | Saxena | 156/643 |

Primary Examiner—William A. Powell
Attorney, Agent, or Firm—Joseph G. Walsh

[57] ABSTRACT

Aluminum microcircuits which have been prepared by reactive-ion etching are stabilized against open circuits and short circuits by treating the microcircuits in an oxygen-containing atmosphere at a temperature of from about 200° C. to about 450° C.

4 Claims, No Drawings

STABILIZATION PROCESS FOR ALUMINUM MICROCIRCUITS WHICH HAVE BEEN REACTIVE-ION ETCHED

DESCRIPTION

Technical Field

This application is concerned with stabilization of aluminum microcircuits which have been prepared by reactive-ion etching. The stabilization is accomplished by heating the microcircuits in an oxygen containing atmosphere at a temperature of from about 200° C. to about 450° C.

BACKGROUND ART

The manufacture of microcircuit devices by means of reactive-ion etching is now well established in the art. Two fairly recent patents which illustrate such processes are U.S. Pat. Nos. 4,026,742 and 4,057,460.

While reactive-ion etching has many advantages in the formation of microcircuits, it does have a disadvantage in the case of circuits based upon aluminum as the conductor. Aluminum which has been subjected to reactive-ion etching tends, upon the passage of time, to disintegrate. This disintegration causes open circuits and short circuits and is obviously a severe disadvantage.

The prior art teaches the treatment of aluminum containing alloys in an oxidizing atmosphere. U.S. Pat. No. 3,496,030 shows the treatment of an aluminum alloy in an atmosphere of helium containing steam. U.S. Pat. No. 3,660,173 shows the treatment of ferro alloys containing some aluminum in an oxidizing atmosphere at a temperature of 1000° C. to 1400° C.

DISCLOSURE OF INVENTION

According to the present invention, a process is provided to prevent the formation of open circuits or short circuits in aluminum microcircuitry which has been formed by reactive-ion etching. It has now been found that aluminum film microcircuits can be given long term stability by heating them in an oxygen containing atmosphere at a temperature of from about 200° C. to about 450° C. The best results have been obtained when the heating is at 350° C. in an atmosphere of oxygen for about ½ hour. Results are less favorable when the temperature is above about 450° C.

When aluminum is referred to in the present application, it is to be understood that the term was intended to include alloys which are chiefly aluminum. Many such alloys are used in the manufacture of microcircuits. For example, an alloy of aluminum with 4% copper is a frequently used one. Another example is an alloy of aluminum with copper and silicon. The process of the present invention is fully applicable to such alloys.

BEST MODE FOR CARRYING OUT THE INVENTION

A film of aluminum alloy with 4% copper approximately 1 micron thick was prepared by vacuum deposition on an oxidized silicon wafer substrate. The film was reactive-ion etched in a plasma of carbon tetrachloride and argon using a T-system diode reactor at 27 MHz frequency with a silicon diode cathode. The input power density was 0.33 watts/cm$^2$. The total pressure was 10$\mu$ and the active gas pressure was 2$\mu$. Photo resist masks were used to pattern the 1$\mu$ thick aluminum layer into a microcircuit.

The aluminum microcircuit prepared above was stabilized by heating for ½ hour at a temperature of 350° C. in one atmosphere of oxygen. Samples which have been heat treated according to this process were found to resist deterioration for much longer periods than untreated samples, and to be free of open circuits and short circuits.

We claim:

1. In a process for forming an aluminum microcircuit on a substrate by the use of reactive-ion etching, the improvement according to which long term stability is imparted to the etched microcircuit by heating it in the presence of an oxygen containing atmosphere at a temperature from about 200° C. to about 450° C.

2. The process as claimed in claim 1 wherein the heating is conducted at 350° C. for at least one-half hour under one atmosphere pressure of oxygen gas.

3. A process as claimed in claim 1 wherein the aluminum is present in the form of an alloy which is 96% aluminum and 4% copper.

4. A process as claimed in claim 2 wherein the aluminum is in the form of an alloy with copper and silicon.

* * * * *